United States Patent [19]

Huynh

[11] Patent Number: 5,021,746
[45] Date of Patent: Jun. 4, 1991

[54] AMPLIFIER OUTPUT STAGE

[75] Inventor: Luong T. Huynh, Epalinges, Switzerland

[73] Assignee: Motorola, Inc., Schaumburg, Ill.

[21] Appl. No.: 447,353

[22] Filed: Dec. 7, 1989

[30] Foreign Application Priority Data

Dec. 10, 1988 [GB] United Kingdom ............... 8828917

[51] Int. Cl.[5] .............................................. H03F 3/26
[52] U.S. Cl. .................................... 330/262; 330/273
[58] Field of Search ............... 330/262, 270, 271, 273, 330/274, 288, 311

[56] References Cited

U.S. PATENT DOCUMENTS 4,025,871  5/1977  Peil .......................... 330/262 X
4,112,385  9/1978  Kusumi ........................ 330/262

Primary Examiner—Steven Mottola
Attorney, Agent, or Firm—Bradley J. Botsch

[57] ABSTRACT

An amplifier output stage for a loudspeaker includes current sourcing and sinking sections arranged in push-pull and a cascode stage for driving the current section and biasing both the sinking and sourcing sections.

7 Claims, 1 Drawing Sheet

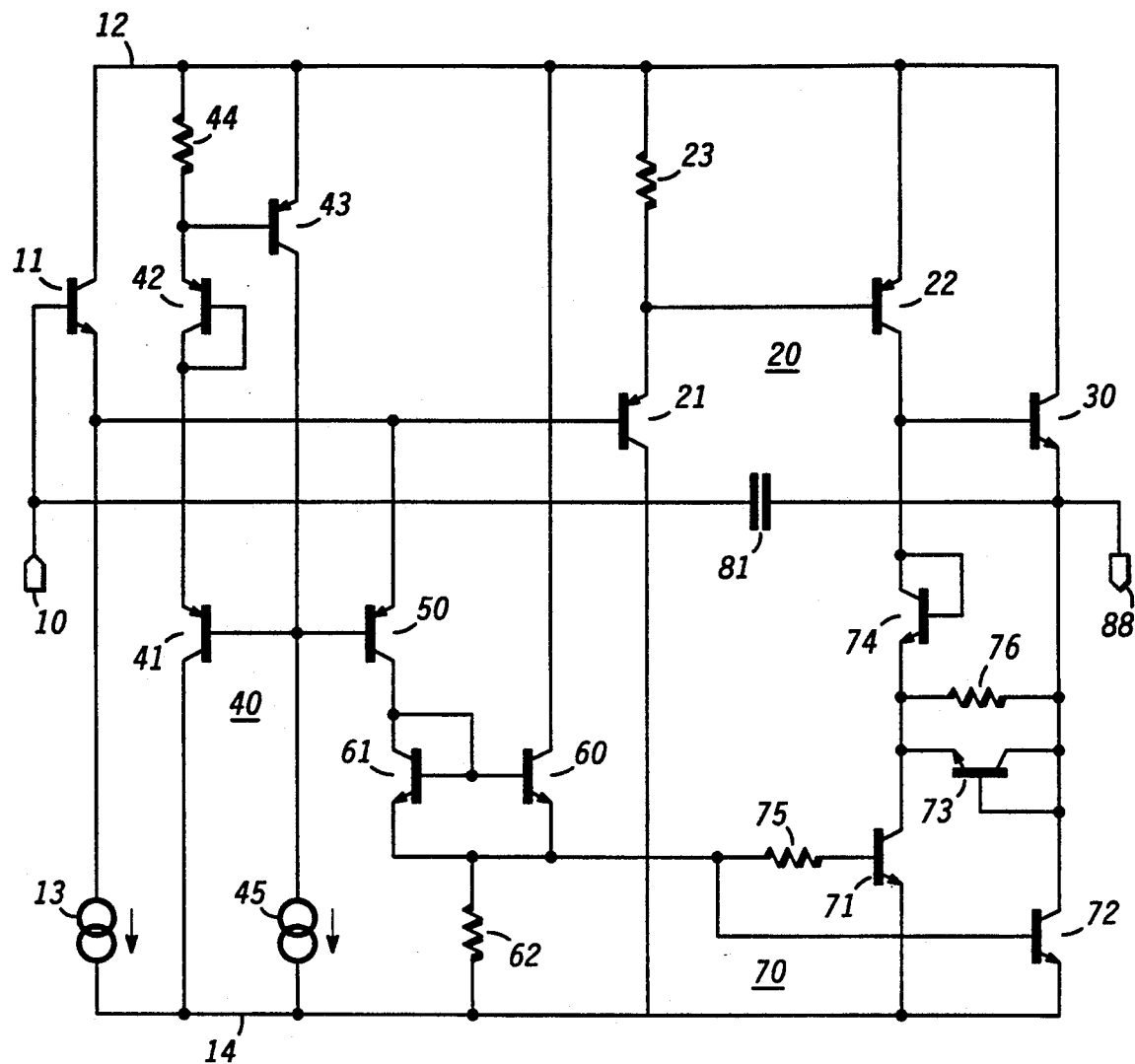
FIG. 1
FIG. 2a  FIG. 2b

AMPLIFIER OUTPUT STAGE

This invention relates to an amplifier output stage and is particularly although not exclusively applicable to an output stage for driving a loudspeaker.

A typical prior art amplifier output stage comprises series connected NPN and PNP transistors arranged to be driven in push pull configuration with the output provided at a node between the two transistors.

In one half cycle of the input signal current is sourced to a load connected to the output, through the NPN transistor whilst in the other half cycle current is sunk from the load by the PNP transistor.

This type of output stage has several problems. It is difficult to obtain a desired bias current for the transistors since this requires a well defined knowledge of their $V_{BE}$ values. Also the use of a PNP power transistor requires more space on the semiconductor die. Generally the circuit has a low current capability.

In another known amplifier the PNP transistor is replaced by a compound darlington PNP-NPN output stage which avoids the need for a large PNP power transistor. This type of amplifier still suffers from the above biasing problem and also has a stability problem, tending to oscillate due to the inclusion of the high gain darlington stage.

This invention seeks to provide an amplifier output stage in which the above problems are mitigated.

According to the invention there is provided a push-pull output stage comprising an input terminal; an output terminal for connection to a load; a current sourcing section coupled to the input terminal for sourcing current to the output terminal; a current sinking section for sinking current from the output terminal; a cascode stage coupled to the input terminal for driving the current sinking stage and biasing both the current sinking and sourcing stages and voltage bias means for biasing the cascode stage.

Preferably the current sourcing stage includes a PNP darlington stage.

The cascode stage is advantageously driven by a low output impedance driver stage, typically an emitter follower stage.

The current sinking section preferably includes a current gain section. The current gain section may be a current mirror or a beta gain coupled transistor.

A Miller capacitance is preferably coupled between the input and output terminals.

An exemplary embodiment of an output stage in accordance with the invention will now be described with reference to the accompanying drawings in which:

FIG. 1 shows one embodiment of the amplifier of the invention; and

FIGS. 2a and 2b show alternative embodiments of current gain section for the amplifier of FIG. 1.

Referring to FIG. 1 an input terminal 10 is coupled to the base of a low impedance driver stage formed by emitter follower stage 11, comprising an NPN transistor having a collector connected to a supply line 12, and an emitter coupled via a current source 13 to a ground reference terminal 14.

The emitter of the NPN transistor 11 is coupled to a PNP darlington stage 20 comprising PNP transistors 21 and 22. The emitters of the two PNP transistors 21 and 22 are coupled to the supply line 12, that of the transistor 21 being coupled to the supply line 12 via a resistor 23 which determines the current through the transistor 21 and also to the base of the transistor 22. The collector of the transistor 21 is coupled to the ground reference terminal 14.

Input to the darlington stage 20 is coupled to the base of the transistor 21 whilst the output is taken from the collector of the transistor 22, which is coupled to drive the base of a current sourcing NPN transistor 30.

The collector of the current sourcing transistor 30 is coupled to the supply line 12 whilst its emitter is coupled to an output terminal 80 to which in operation a load, such as a loudspeaker is connected.

The transistors 21, 22 and 30 together with the resistor 23 form a current sourcing section for sourcing current to the output terminal 80. The emitter of the emitter follower transistor 11 is also coupled to the emitter of a cascode connected PNP transistor 50 whose base is coupled to a bias voltage source 40.

The voltage source 40 comprises three PNP transistors 41, 42 and 43, one resistor 44 and one current source 45.

The emitter of the PNP transistor 43 is coupled to the supply line 12. The PNP transistor 41 has its base coupled to the collector of the PNP transistor 43 and to the ground reference terminal 14 via a current source 45, has its collector coupled to the ground reference terminal 14 and its emitter coupled to the base and the collector of the PNP transistor 42. The emitter of the PNP transistor 42 is coupled to the base of the PNP transistor 43 and to the supply line 12 via the resistor 44 which fixes the current through the PNP transistors 41 and 42. The current source 45 supplies current to the PNP transistor 43. The output of the voltage source 40 is taken at the base of the PNP transistor 41 which is coupled to the base of the cascode transistor 50. It provides a voltage which is three base-emitter junction voltages from the supply line 12.

The collector of the cascode transistor 50 is coupled to a current gain section including one resistor 62 and two NPN current mirror connected transistors 60 and 61, having a gain factor equal to the ratio of their emitter areas plus one. The emitters of the NPN transistors 60 and 61 are coupled together and to the ground reference terminal 14 via a resistor 62 which fixes the current through the transistors 50, 60 and 61. The bases of transistors 60 and 61 are connected together and to the collectors of the cascode PNP transistor 50 and the NPN transistor 61. The collector of npn transistor 60 is coupled to the supply line 12. If a high gain is required, the PNP transistor 61 is advantageously replaced by a resistor 63 coupled as shown in FIG. 2a or 2b to form a NPN beta gain with resistor.

The cascode PNP transistor 50, by virtue of the connections of its emitter to the base of the PNP darlington transistor 21 and of its base to the output of the voltage source 40, is operative to provide biasing voltage for that darlington stage. This means that the three base-emitter junction voltages of the voltage source 40 are matched with three base-emitter junctions of the PNP transistors 50, 21 and 22. Once the collector current in the cascode PNP transistor 50 is supplied by the following current gain section, the current in the PNP transistor 22 is determined and is a function of the current source 45.

The emitters of the current gain stage transistors 60 and 61 are coupled to drive a current sinking section 70 connected to sink current from the output terminal 80 during the appropriate half cycle of the input signal.

The current sinking section comprises four NPN transistors 71, 72, 73 74 and two resistors 75 and 76. The emitters of the transistors 60 and 61 of the current gain section are coupled to the base of the NPN transistor 72 and to that of the NPN transistor 71 via a resistor 75. The emitters of the NPN transistors 71 and 72 are coupled to the ground reference terminal 14. The collector of the NPN transistor 71 is coupled in its turn to the collector of the PNP transistor 22 of the PNP darlington stage via the NPN transistor 74 connected as a diode, while the collector of the NPN transistor 72 is coupled to output terminal 80.

Thus the vital loop is created to ensure the good bias of the circuit. The current from the collector of the PNP transistor 22 fixes the current in the collector of the NPN transistor 71. And the coupling between the bases of the transistors 71 and 72 fixes the current in the collector of the transistor 72 which in turn fixes the current in the transistor 30 The amplitude of the collector quiescent current of the transistor 72 depends on the ratio of the emitter areas of the transistors 71 and 72.

The NPN transistor 73, mounted as a diode between the collectors of the transistors 71 and 72, is used to prevent saturation of the transistor 71 at a middle sinking current. At a high sinking current, the resistor 75 limits the collector current of the transistor 71 and allows the voltage at the output terminal 80 to reach the value of the saturation voltage of the transistor 72. The diode connected transistor 74 and the resistor 76 coupled between the collectors of the transistors 71 and 72 are used to smooth the cross-over passage.

A Miller capacitance 81 coupled between the input terminal 10 and output terminal 80 is used to compensate the amplifier frequency phase shift.

In operation an oscillating input signal, such as the audio signal from a preamplifier, is applied to the input terminal 10 of the amplifier.

During the half cycle of the input signal in which current is fed into the base of the emitter follower stage transistor 11, the emitter follower provides an emitter dynamic output current which flows through the cascode transistor 50 into the current gain stage 60. This stage in turn drives the current section 70 which sinks current from the output terminal 80.

In the opposite half cycle current flows out from the base of the emitter follower transistor 11, which absorbs current from the PNP darlington stage 20 causing current to be drawn through the transistors 21 and 22 to the base of the transistor 30. The transistor 30 in turn sources current to the output terminal 80.

The relationships between the currents $\Delta I_1$ and $\Delta I_2$ respectively sourced to and sunk from the output terminal 80, and the current $\Delta I$ of the emitter follower stage 11 are as follows:

$$\Delta I_1 = \Delta I \cdot \beta^2_P \cdot \beta_N$$

$$\Delta I_2 = \Delta I \cdot N \cdot \beta_N$$

where $\beta_P$ and $\beta_N$ are the respective gains of the PNP and NPN transistors of the circuit and N is the gain factor of the current gain section.

Depending on the value of the PNP gain $\beta_P$, the gain factor N can be chosen to obtain equality of the transfer function characteristic.

The amplifier circuit of the invention has a number of advantages over the prior art circuits described previously. Although the circuit has a high current capability, it is inherently more stable than the prior art circuits due to its being driven by an emitter follower stage which provides a low impedance drive.

Biasing of the circuit by way of the cascode stage 50 is extremely simple and stable.

The invention has been described by way of example and modifications may be made without departing from the scope of the invention. For example any convenient low impedance driver stage may replace the emitter follower 11.

I claim:

1. A push-pull output stage comprising an input terminal; an output terminal for connection to a load, a current sourcing section coupled to the input terminal for sourcing current to the output terminal; a current sinking section for sinking current from the output terminal; a cascode stage driven by a lower impedance driver stage which is coupled to the input terminal for driving the current sinking stage and biasing both the current sinking and sourcing stages; and voltage bias means for biasing the cascode stage.

2. The output stage of claim 1 wherein the current sourcing section includes a PNP darlington stage.

3. The output stage of claim 2 wherein the low output impedance driver stage is an emitter follower.

4. The output stage of claim 1 wherein the current sinking stage includes a current gain section.

5. The output stage of claim 4 wherein the current gain section comprises a current mirror.

6. The output stage of claim 4 wherein the current gain stage comprises a beta gain coupled transistor.

7. The output stage of claim 1 and including a Miller capacitance coupled between the input and output terminals.

* * * * *